(12) United States Patent
Wang

(10) Patent No.: US 11,456,304 B2
(45) Date of Patent: Sep. 27, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 9 days.

(21) Appl. No.: 17/104,179

(22) Filed: Nov. 25, 2020

(65) Prior Publication Data
US 2022/0037338 A1 Feb. 3, 2022

(30) Foreign Application Priority Data
Jul. 31, 2020 (CN) .......................... 202010760781.X

(51) Int. Cl.
*H01L 27/11* (2006.01)
*H01L 29/78* (2006.01)
*H01L 23/522* (2006.01)

(52) U.S. Cl.
CPC ...... *H01L 27/1104* (2013.01); *H01L 23/5226* (2013.01); *H01L 29/7833* (2013.01)

(58) Field of Classification Search
CPC ............. H01L 27/1104; H01L 23/5226; H01L 29/7833
(Continued)

(56) References Cited

U.S. PATENT DOCUMENTS

2020/0312994 A1* 10/2020 You ....................... H01L 21/764
2021/0082770 A1* 3/2021 Xie ................. H01L 21/823431

* cited by examiner

*Primary Examiner* — Tu-Tu V Ho
(74) *Attorney, Agent, or Firm* — Crowell & Moring, L.L.P.

(57) ABSTRACT

A semiconductor structure and a forming method thereof are provided. The method includes: providing a base having a gate structure, where there is a gate cap layer on the top of the gate structure, there is a source/drain doped region in the base on two sides of the gate structure, there is a bottom dielectric layer on the base, the base includes a shared contact region that is used for forming a shared contact plug, the source/drain doped region located in the shared contact region is used as a first source/drain doped region, and the remaining is used as a second source/drain doped region; forming, in a bottom dielectric layer, a first source-drain interconnection layer connected to the second source/drain doped region, and a source/drain cap layer located on the top of the first source-drain interconnection layer; forming, in the bottom dielectric layer, a second source-drain interconnection layer connected to the first source/drain doped region; forming a top dielectric layer covering the gate cap layer, the source/drain cap layer, the second source-drain interconnection layer, and the bottom dielectric layer; and forming, in the shared contact region, a shared contact plug running through the top dielectric layer and the gate cap layer. According to the present disclosure, difficulty in forming the shared contact plug is reduced, and the performance of the semiconductor structure is improved.

18 Claims, 7 Drawing Sheets

(58) Field of Classification Search
USPC .......................................................... 257/288
See application file for complete search history.

SEMICONDUCTOR STRUCTURE AND FORMING METHOD THEREOF

RELATED APPLICATIONS

The present application claims priority to Chinese Patent Appin. No. 202010760781.X, filed Jul. 31, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the continuous development of integrated circuit manufacturing technologies, people have increasingly high requirements on the integration level and performance of integrated circuits. To improve the integration level and reduce costs, critical dimensions of the components are continuously reduced, and the circuit density inside the integrated circuit is becoming increasingly high. Such a development trend makes the wafer surface unable to provide a sufficient area for fabricating required interconnection lines.

To meet the requirement of the interconnection lines after the critical dimensions are reduced, currently, a connection between different metal layers or between a metal layer and a base is implemented through an interconnection structure. The interconnection structure includes the interconnection lines and contact hole plugs formed inside a contact opening. The contact hole plugs are connected to a semiconductor device, and the interconnection lines implement connection between the contact hole plugs, so as to form a circuit. The contact hole plugs inside a transistor structure include a gate contact hole plug, which is located on a surface of a gate structure and configured to implement connection between the gate structure and an external circuit. The contact hold plugs further include a source/drain contact hole plug, which is located on a surface of a source/drain doped region and configured to implement connection between the source/drain doped region and an external circuit; and further includes a shared contact plug which is configured to electrically connect a gate to the source/drain doped region.

Currently, to further reduce the transistor area, a contact over active gate (COAG) process is introduced. Compared with the conventional gate contact hole plug located above a gate structure of an isolation area, the gate contact hole plug can be fabricated above a gate structure of an active area (AA) using the COAG process, so as to further save the area of chip.

SUMMARY

A problem addressed by embodiments and implementations of the present disclosure is to provide a semiconductor structure and a forming method thereof, to improve the performance of a semiconductor structure while reducing difficulty in forming a shared contact plug.

To address the foregoing problem, one form of the present disclosure provides a forming method of a semiconductor structure, including: providing a base, a gate structure being formed on the base, a gate cap layer being formed on a top of the gate structure, a source/drain doped region being formed in the base on two sides of the gate structure, a bottom dielectric layer being formed on the base at a side portion of the gate structure, and the bottom dielectric layer covering side walls of the gate structure and the gate cap layer, where a region that is located at the base and that is used for forming a shared contact plug electrically connecting the gate structure and the source/drain doped region is used as a shared contact region, the source/drain doped region located in the shared contact region is used as a first source/drain doped region, and the remaining source/drain doped region is used as a second source/drain doped region; forming, in a bottom dielectric layer on the top of the second source/drain doped region, a first source-drain interconnection layer connected to the second source/drain doped region, and a source/drain cap layer located on the top of the first source-drain interconnection layer; forming, in the bottom dielectric layer on the top of the first source/drain doped region, a second source-drain interconnection layer connected to the first source/drain doped region; forming a top dielectric layer covering the gate cap layer, the source/drain cap layer, the second source-drain interconnection layer, and the bottom dielectric layer; and forming, in the shared contact region, a shared contact plug running through the top dielectric layer and the gate cap layer, the shared contact plug electrically connecting the gate structure and the second source-drain interconnection layer.

Another form of the present disclosure provides a semiconductor structure, including: a base, a gate structure being formed on the base, a gate cap layer being formed on a top of the gate structure, a source/drain doped region being formed in the base of two sides of the gate structure, a bottom dielectric layer being formed on the base at a side portion of the gate structure, and the bottom dielectric layer covering side walls of the gate structure and the gate cap layer, where a region that is located at the base and that is used for forming a shared contact plug electrically connecting the gate structure and the source/drain doped region is used as a shared contact region, the source/drain doped region located in the shared contact region is used as a first source/drain doped region, and the remaining source/drain doped region is used as a second source/drain doped region; a first source-drain interconnection layer, located in a bottom dielectric layer on the top of the second source/drain doped region and connected to the second source/drain doped region, a top of the first source-drain interconnection layer being lower than the top of the gate cap layer; a source/drain cap layer, located at a region surrounded by the top of the first source-drain interconnection layer and the bottom dielectric layer; a second source-drain interconnection layer, running through the bottom dielectric layer on the top of the first source/drain doped region; and a top dielectric layer, covering the gate cap layer, the source/drain cap layer, the second source-drain interconnection layer, and the bottom dielectric layer.

Compared with the prior art, technical solutions of embodiments and implementations of the present disclosure have the following advantages:

In implementations of the forming method of the present disclosure, the first source-drain interconnection layer connected to the second source/drain doped region, and the source/drain cap layer located on the top of the first source-drain interconnection layer are formed in the bottom dielectric layer on the top of the second source/drain doped region; and the second source-drain interconnection layer connected to the first source/drain doped region is formed in a bottom dielectric layer on the top of the first source/drain doped region. Subsequently, in a process of forming, in the shared contact region, the shared contact plug running through the top dielectric layer and the gate cap layer, the step of forming the shared contact plug includes etching the top dielectric layer and the gate cap layer of the shared contact region to form the shared contact hole exposing the gate structure and the second source-drain interconnection layer. Because the source/drain cap layer is not formed on the top of the second source-drain interconnection layer, the source/drain cap layer does not need to be etched when the shared contact hole is formed, so that difficulty of an etching process adopted for forming the shared contact plug is reduced, and difficulty in forming the shared contact plug is reduced correspondingly. Moreover, this is beneficial to shortening a process time required for forming the shared contact hole, to reduce the impact of lateral etching on the top dielectric layer, so that the cross-sectional shape and the opening size of the shared contact hole are guaranteed. Correspondingly, a probability that the shared contact hole exposes the gate structure or the first source-drain interconnection layer that is other than the shared contact hole and that is adjacent to the shared contact hole is reduced, to reduce a probability that the shared contact plug and the gate structure or the first source-drain interconnection layer that is other than the shared contact plug and that is adjacent to the shared contact plug are short-circuited, thereby further improving the performance of the semiconductor structure.

DETAILED DESCRIPTION

Currently, after a contact over active gate (COAG) process is introduced, it is relatively difficult to form a shared contact plug, and a process risk is relatively high. Reasons for the relatively high difficulty in forming a shared contact plug and for the relatively high process risk are analyzed below with reference to a semiconductor structure.

FIG. 1 to FIG. 4 are schematic structural diagrams corresponding to steps in a method for forming a semiconductor structure.

Figure 1:
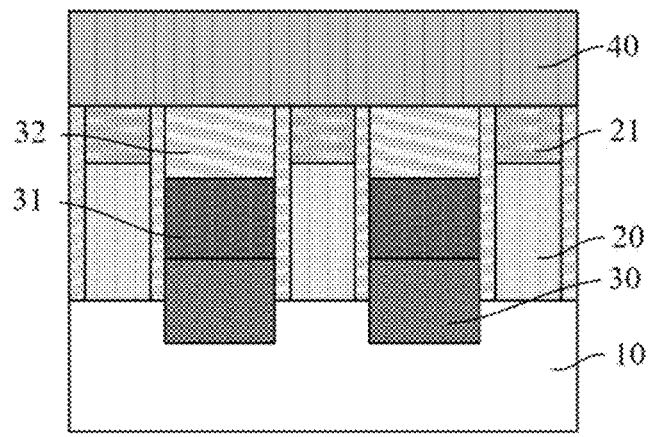
FIG. 1 to FIG. 4 are schematic structural diagrams corresponding to steps in a method for forming a semiconductor structure.

Referring to FIG. 1, a base 10 is provided. A gate structure 20 is formed on the base 10, a gate cap layer 21 is formed on the top of the gate structure 20, a source/drain doped region 30 is formed in the base 10 on two sides of the gate structure 20, and a bottom dielectric layer (not shown in the figure) is formed on the base 10 at a side portion of the gate structure 20. The bottom dielectric layer covers side walls of the gate structure 20 and the gate cap layer 21, and a source-drain interconnection layer 31 and a source/drain cap layer 32 located on the top of the source-drain interconnection layer 31 are formed in a bottom dielectric layer on the top of the source/drain doped region 30.

A region that is located at the base 10 and that is used for forming a shared contact plug electrically connecting the gate structure 20 and the source/drain doped region 30 is used as a shared contact region (not marked).

Still referring to FIG. 1, a top dielectric layer 40 covering the gate cap layer 21 and the source/drain cap layer 32 is formed.

Subsequently, a gate plug running through the top dielectric layer 40 and the gate cap layer 21 is formed at the top of the gate structure 20, and the gate plug is formed on an AA, and is a COAG. Moreover, a source/drain plug running through the top dielectric layer 30 and the source/drain cap layer 32 is subsequently formed at the top of the source-drain interconnection layer 31.

In the COAG process, to reduce a probability that the source/drain plug is bridged with the gate structure 20, and the gate plug is bridged with the source-drain interconnection layer 31, there is a relatively high etching selection ratio between the gate cap layer 21 and the source/drain cap layer 32. Therefore, the source/drain cap layer 32 can protect the source-drain interconnection layer 31 in a process of forming the gate plug, and the gate cap layer 21 can protect the gate structure 20 in a process of forming the source/drain plug.

According to design requirements, in a process of forming the semiconductor structure, it is not only necessary to form the source/drain plug at the top of the source-drain interconnection layer 31 and form the gate plug at the top of the gate structure 20, but also necessary to form the shared contact plug electrically connecting the gate structure 20 and the source-drain interconnection layer 31.

Figure 2:
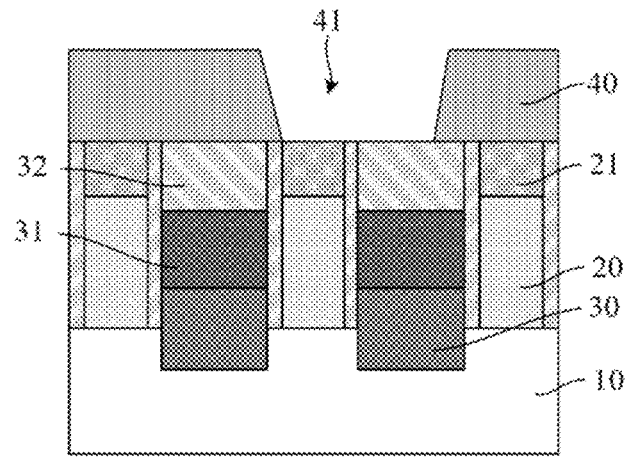
Figure 3:
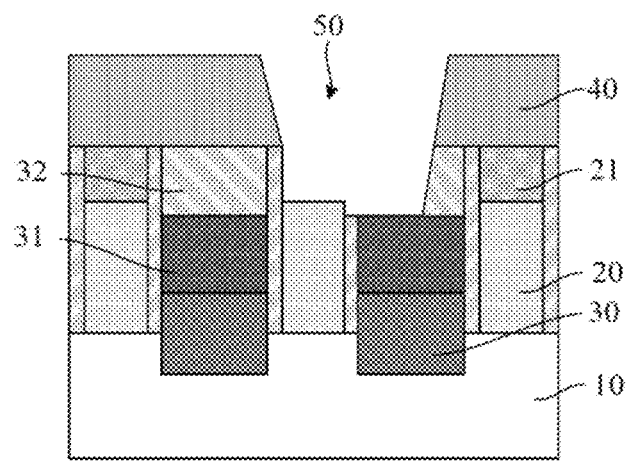
Figure 4:
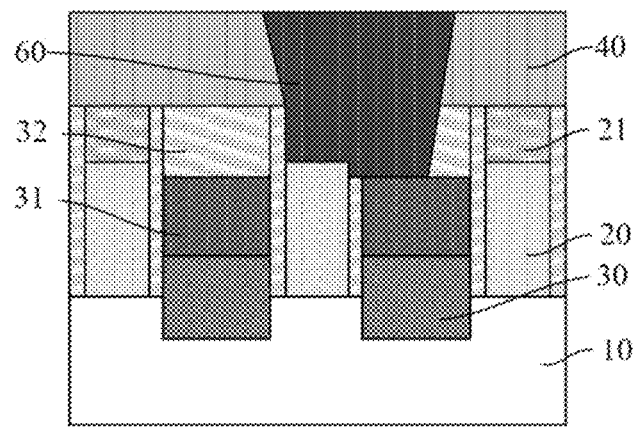

With reference to FIG. 2 to FIG. 4, in the shared contact region, a shared contact plug 60 (as shown in FIG. 4) running through the top dielectric layer 40, the gate cap layer 21, and the source/drain cap layer 32 is formed, and the shared contact plug 60 is in contact with the gate structure 20 and the source-drain interconnection layer 31.

Specifically, the step of forming the shared contact plug 60 includes: as shown in FIG. 2, etching the top dielectric layer 40 of the shared contact region to form an opening 41 exposing the gate cap layer 21 and the source/drain cap layer 32; as shown in FIG. 3, etching the gate cap layer 21 and the source/drain cap layer 32 at a bottom of the opening 41 to form a shared contact hole 50 running through the top dielectric layer 40, the gate cap layer 21, and the source/drain cap layer 32, the shared contact hole 50 exposing the gate structure 20 and the source-drain interconnection layer 31; and as shown in FIG. 4, forming the shared contact plug 60 in the shared contact hole 50.

Because there is a relatively high etching selection ratio between the gate cap layer 21 and the source/drain cap layer 32, after the top dielectric layer 40 is etched, the gate cap layer 21 and the source/drain cap layer 32 need to be etched using different etching processes. In a process of etching the gate cap layer 21 and the source/drain cap layer 32, the opening 41 in the top dielectric layer 40 is likely to be affected by the lateral etching, resulting in adverse impact on a cross-sectional shape of the opening 41, or even a problem that the size of the opening 41 increases. Therefore, it is likely to cause mis-etching of the adjacent gate cap layer 21 or the source/drain cap layer 32 that is other than the opening 41 and that is adjacent to the opening 41, and correspondingly, a probability that the shared contact plug 60 and the gate structure 20 or the source-drain interconnection layer 31 that is other than the shared contact plug 60 and that is adjacent to the shared contact plug 60 are short-circuited is increased.

Therefore, forming the shared contact plug 60 is relatively difficult, and the performance of the semiconductor structure is likely to be degraded.

To resolve the foregoing technical problems, some implementations of the present disclosure provides a forming method of a semiconductor structure, including: providing a base, a gate structure being formed on the base, a gate cap layer being formed on the top of the gate structure, a source/drain doped region being formed in the base on two sides of the gate structure, a bottom dielectric layer being formed on the base at a side portion of the gate structure, and the bottom dielectric layer covering side walls of the gate structure and the gate cap layer, where a region that is located at the base and that is used for forming a shared contact plug electrically connecting the gate structure and the source/drain doped region is used as a shared contact region, the source/drain doped region located in the shared contact region is used as a first source/drain doped region, and the remaining source/drain doped region is used as a second source/drain doped region; forming, in a bottom dielectric layer on the top of the second source/drain doped region, a first source-drain interconnection layer connected to the second source/drain doped region, and a source/drain cap layer located on the top of the first source-drain interconnection layer; forming, in the bottom dielectric layer on the top of the first source/drain doped region, a second source-drain interconnection layer connected to the first source/drain doped region; forming a top dielectric layer covering the gate cap layer, the source/drain cap layer, the second source-drain interconnection layer, and the bottom dielectric layer; and forming, in the shared contact region, a shared contact plug running through the top dielectric layer and the gate cap layer, the shared contact plug electrically connecting the gate structure and the second source-drain interconnection layer.

In methods for forming semiconductor structures provided in embodiments and implementations of the present disclosure, the first source-drain interconnection layer connected to the second source/drain doped region, and the source/drain cap layer located on the top of the first source-drain interconnection layer are formed in the bottom dielectric layer on the top of the second source/drain doped region; and the second source-drain interconnection layer connected to the first source/drain doped region is formed in a bottom dielectric layer on the top of the first source/drain doped region. Subsequently, in a process of forming, in the shared contact region, the shared contact plug running through the top dielectric layer and the gate cap layer, the step of forming the shared contact plug includes etching the top dielectric layer and the gate cap layer of the shared contact region to form the shared contact hole exposing the gate structure and the second source-drain interconnection layer. Because the source/drain cap layer is not formed on the top of the second source-drain interconnection layer, the source/drain cap layer does not need to be etched when the shared contact hole is formed, so that the difficulty of an etching process adopted for forming the shared contact plug is reduced, and difficulty in forming the shared contact plug is reduced correspondingly. Moreover, this is beneficial to shortening a process time required for forming the shared contact hole, to reduce the impact of lateral etching on the top dielectric layer, so that the cross-sectional shape and the opening size of the shared contact hole are guaranteed. Correspondingly, a probability that the shared contact hole exposes the gate structure or the first source-drain interconnection layer that is other than the shared contact hole and that is adjacent to the shared contact hole is reduced, to reduce a probability that the shared contact plug and the gate structure or the first source-drain interconnection layer that is other than the shared contact plug and that is adjacent to the shared contact plug are short-circuited, thereby further improving the performance of the semiconductor structure.

To make the foregoing objectives, features, and advantages of the embodiments of the present disclosure more apparent and easier to understand, the specific embodiments of the present disclosure are described in detail below with reference to the drawings.

FIG. 5 to FIG. 19 are schematic structural diagrams corresponding to steps in one form of a method for forming a semiconductor structure according to the present disclosure.

Figure 5:
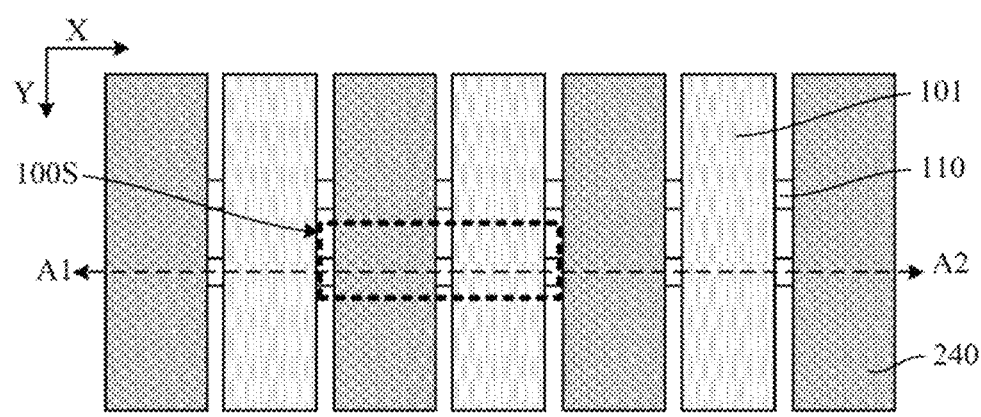
FIG. 5 to FIG. 19 are schematic structural diagrams corresponding to steps in one form of a method for forming a semiconductor structure according to the present disclosure.
Figure 6:
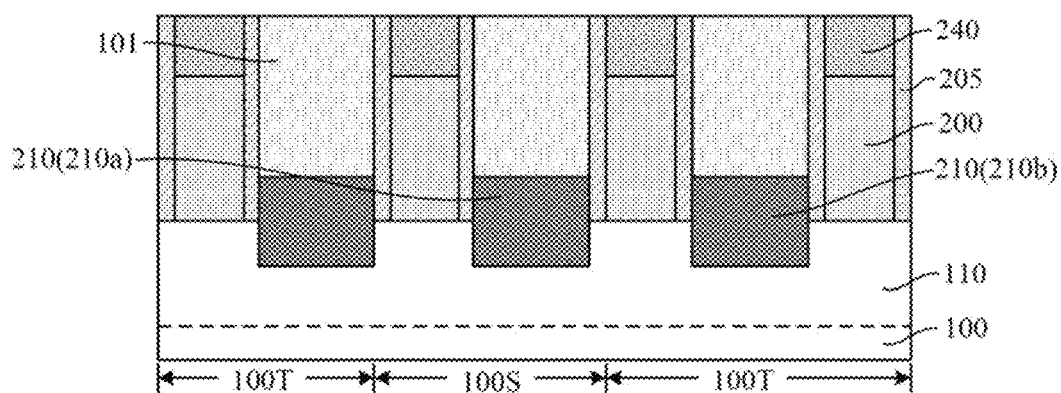

With reference to FIG. 5 and FIG. 6, FIG. 5 is a top view, and FIG. 6 is a cross-sectional view along a section line A1-A2 in FIG. 5. A base (not marked) is provided, a gate structure 200 being formed on the base, a gate cap layer 240 being formed on the top of the gate structure 200, a source/drain doped region 210 being formed in the base of two sides of the gate structure 200, a bottom dielectric layer 101 being formed on the base at a side portion of the gate structure 200, and the bottom dielectric layer 101 covering side walls of the gate structure 200 and the gate cap layer 240, where a region that is located at the base and that is used for forming a shared contact plug electrically connecting the gate structure 200 and the source/drain doped region 210 is used as a shared contact region 100S. The source/drain doped region 210 located in the shared contact region 100S is used as a first source/drain doped region 210a, and the remaining source/drain doped region 210 is used as a second source/drain doped region 210b.

For ease of illustration, FIG. 2 only shows the source/drain doped region 210, the gate cap layer 240, and the bottom dielectric layer 101.

The base is used for providing a process platform for subsequent procedures of the process.

In some implementations, the base is used for forming a fin field effect transistor (FinFET). Therefore, the base includes a substrate 100 and a fin 110 protruding from the substrate 100. In other implementations, when the base is used for forming a planar FET, the base is a planar substrate correspondingly.

In some implementations, the substrate 100 is a silicon substrate.

In other implementations, the substrate may alternatively be a substrate made from another type of material. For example, the substrate may be made of other materials such as germanium, silicon germanium, silicon carbide, gallium arsenide, or indium gallium, and the substrate may alternatively be another type of substrate such as a silicon substrate over an insulator or a germanium substrate over an insulator.

In some implementations, the material of the fin 110 is the same as the material of the substrate 100.

In some implementations, the base is used for forming a static random access memory (SRAM) device. According to design requirements of the SRAM device, some gate structures 200 and source/drain doped regions 210 need to be electrically connected through a shared contact plug.

In some implementations, a region that is located at the base and that is used for forming a shared contact plug electrically connecting the gate structure 200 and the source/drain doped region 210 is used as a shared contact region 100S.

In some implementations, the gate structure 200 extends in a first direction (shown by a direction Y in FIG. 5), and a direction parallel to the base surface and perpendicular to the first direction is a second direction (shown by a direction X in FIG. 5). The shared contact region 100S extends in the second direction.

Specifically, there are a plurality of gate structures 200, and the plurality of gate structures 200 are arranged in parallel in the second direction.

In some implementations, a region other than the shared contact region 100S is used as a non-shared contact region 100T (as shown in FIG. 6). Subsequently, in the non-shared contact region 100T, gate plugs in a one-to-one correspondence with the gate structures 200 and source/drain plugs in a one-to-one correspondence with the source/drain doped regions 210 are formed.

In some implementations, the forming method of a semiconductor structure further includes: forming, after the fin 110 is formed, an isolation layer (not shown in the figure) on the substrate 100 exposed by the fin 110, the isolation layer covering a part of a side wall of the fin 110.

The isolation layer is used for isolating adjacent devices. The material of the isolation layer may be silicon oxide, silicon nitride, or silicon oxynitride. In some implementations, the material of the isolation layer is silicon nitride.

In some implementations, the gate structure 200 is located on the isolation layer, and the gate structure 200 spans the fin 110 and covers a part of the top of and a part of a side wall of the fin 110.

In some implementations, the gate structure is a device gate structure, and the gate structure 200 is used for controlling on or off of a conducting channel when the device is working.

Specifically, the gate structure 200 is a metal gate structure, and the gate structure 200 includes a high-k gate dielectric layer (not shown in the figure), a work function layer (not shown in the figure) located on the high-k gate dielectric layer, and a gate electrode layer (not shown in the figure) located on the work function layer.

The material of the high-k gate dielectric layer is a high-k dielectric material, where the high-k dielectric material refers to a dielectric material having a relative dielectric constant greater than a relative dielectric constant of silicon oxide. Specifically, the material of the high-k gate dielectric layer may be selected from the $HfO_2$, $ZrO_2$, HfSiO, HfSiON, HfTaO, HfTiO, HfZrO, $Al_2O_3$, or the like.

The work function layer is used for adjusting a threshold voltage of a formed transistor. When a PMOS transistor is formed, the work function layer is a P-type work function layer, and the material of the P-type work function layer includes one or more of TiN, TaN, TaSiN, TaAlN, and TiAlN; and when an NMOS transistor is formed, the work function layer is an N-type work function layer, and the material of the N-type work function layer includes one or more of TiAl, Mo, MoN, AlN, and TiAlC.

The gate electrode layer is used for leading out the electricity of the gate structure 200. In some implementations, the material of the gate electrode layer is Al, Cu, Ag, Au, Pt, Ni, Ti, or W.

In some implementations, the source/drain doped region 210 is located in the fin 110 on two sides of the gate structure 200.

Specifically, adjacent gate structures 200 share one source/drain doped region 210.

When the NMOS transistor is formed, the source/drain doped region 210 includes a stress layer doped with N-type ions, the material of the stress layer is Si or SiC, and the stress layer provides a tensile stress function for a channel region of the NMOS transistor, thereby facilitating improving the carrier mobility of the NMOS transistor, where the N-type ions are P ions, As ions or Sb ions. When the PMOS transistor is formed, the source/drain doped region 210 includes a stress layer doped with P-type ions, the material of the stress layer is Si or SiGe, and the stress layer provides a compressive stress function for a channel region of the PMOS transistor, thereby facilitating improving the carrier mobility of the PMOS transistor, where the P-type ions are B ions, Ga ions or In ions.

In some implementations, the source/drain doped region 210 located in the shared contact region 100S is used as a first source/drain doped region 210a, and the remaining source/drain doped region 210 is used as a second source/drain doped region 210b, that is, the source/drain doped region 210 located in the non-shared contact region 100T is used as the second source/drain doped region 210b.

It should be noted that in some implementations, a spacer 205 further is formed on a side wall of the gate structure 200.

The spacer 205 is used for defining a forming region of the source/drain doped region 210, and the spacer 205 is further used for protecting the side wall of the gate structure 200. The spacer 205 may be of a single-layer structure or a laminated structure, and the material of the spacer 205 includes one or more of silicon oxide, silicon nitride, silicon carbide, silicon carbon nitride, silicon oxycarbonitride, silicon oxynitride, boron nitride, and boron carbon nitride.

In an example, the spacer 205 is of a single-layer structure, and the material of the spacer 205 is silicon nitride.

Subsequently, after the first source-drain interconnection layer connected to the second source/drain doped region 210b and the source/drain cap layer located on the top of the first source-drain interconnection layer are formed in the bottom dielectric layer 101 on the top of the second source/drain doped region 210b, and then, after the top dielectric layer is formed on the bottom dielectric layer 101, a source/drain plug in contact with the first source-drain interconnection layer is formed on the top of the first source-drain interconnection layer. The gate cap layer 240 is located on a top surface of the gate structure 200, and is used for protecting the gate structure 200, to reduce, in a process of forming the source/drain plug, damage to the gate structure 200 and a probability that the source/drain plug and the gate structure 200 are short-circuited.

A material having etching selectivity to the source/drain cap layer, the bottom dielectric layer 101, and the top dielectric layer formed subsequently is selected as the material of the gate cap layer 240, which is beneficial to ensuring that the gate cap layer 240 can protect the gate structure 200.

In some implementations, the material of the gate cap layer 240 includes one or more of silicon nitride, silicon carbide, silicon carbon nitride, silicon oxycarbonitride, silicon oxynitride, boron nitride, and boron carbon nitride.

In an example, the material of the gate cap layer 240 is silicon nitride.

The materials of the gate cap layer 240 is the same as that of the spacer 205, thereby facilitating etching the spacer 205 while etching the gate cap layer 240 in a subsequent process of forming the shared contact hole, so that the complexity of an etching process is reduced. Moreover, film layer materials of relatively few types may be used in a forming process of the semiconductor structure, which is also beneficial to reducing the process complexity.

In other implementations, the gate cap layer may alternatively be made of a material different from that of the spacer.

In some implementations, the gate structure 200 is formed by adopting a high k last/metal gate last process. Therefore, the spacer 205 covers the side walls of the gate structure 200 and the gate cap layer 240.

Specifically, after the gate structure 200 is formed in the bottom dielectric layer 101, a part of the gate structure 200 in thickness is back etched; and after the part of the gate structure 200 in thickness is back etched, the gate cap layer 240 is formed in a region surrounded by the bottom dielectric layer 101 and the remaining gate structure 200.

The step of forming the gate cap layer 240 includes a step of depositing a gate cap material layer and a step of performing planarization (chemical mechanical polishing process) on the gate cap material layer that are performed successively.

The bottom dielectric layer 101 is used for isolating adjacent devices.

Subsequently, the first source-drain interconnection layer in contact with the second source/drain doped region 210*b* is formed in the bottom dielectric layer 101 on the top of the second source/drain doped region 210*b*, and the second source-drain interconnection layer connected to the first source/drain doped region 210*a* is formed in the bottom dielectric layer 101 on the top of the first source/drain doped region 210*a*, and the bottom dielectric layer 101 is further used for implementing electrical isolation between the first source-drain interconnection layer and the second source-drain interconnection layer.

In some implementations, the bottom dielectric layer 101 is an interlayer dielectric (ILD) layer.

The material of the bottom dielectric layer 101 is an insulating material, and the material of the bottom dielectric layer 101 includes one or more of silicon oxide, silicon nitride, silicon oxynitride, silicon oxycarbide, silicon carbonitride, and silicon oxy-carbonitride. In some implementations, the material of the bottom dielectric layer 101 is silicon nitride.

In some implementations, tops of the bottom dielectric layer 101, the gate cap layer 240, and the spacer 205 are flush with each other.

With reference to FIG. 7 to FIG. 11, a first source-drain interconnection layer 220 connected to the second source/drain doped region 210*b* and a source/drain cap layer 230 located on the top of the first source-drain interconnection layer 220 are formed in a bottom dielectric layer 101 on the top of the second source/drain doped region 210*b*.

The first source-drain interconnection layer 220 is in contact with the second source/drain doped region 210*b*, and is used for electrically connecting the second source/drain doped region 210*b* to an external circuit or another interconnection structure.

In some implementations, subsequently, the source/drain plug in contact with the first source-drain interconnection layer 220 is formed at the first source-drain interconnection layer 220, and the source/drain plug is electrically connected to the second source/drain doped region 210*b* through the first source-drain interconnection layer 220.

In some implementations, the material of the first source-drain interconnection layer 220 is copper. The resistivity of copper is relatively low, which is beneficial to alleviating an RC signal delay at the later stage and improving a processing speed of the chip, and is also beneficial to reducing resistance of the first source-drain interconnection layer 220, thereby reducing power consumption correspondingly. In other implementations, the material of the first source-drain interconnection layer may alternatively be a conductive material such as tungsten or cobalt.

Subsequently, after the top dielectric layer is formed on the bottom dielectric layer 101, in the non-shared contact region 100T, a gate plug in contact with the gate structure 200 is formed at the top of the gate structure 200 in an AA. The source/drain cap layer 230 is located on a top surface of the first source-drain interconnection layer 220, and is used for protecting the first source-drain interconnection layer 220 in a process of forming the gate plug, which is beneficial to reducing damage to the first source-drain interconnection layer 220 and a probability that the gate plug and the first source-drain interconnection layer 220 are short-circuited.

A material having relatively high etching selectivity to the gate cap layer 240, the spacer 205, the bottom dielectric layer 101, and the top dielectric layer formed subsequently is selected as the material of the source/drain cap layer 230, which is beneficial to ensuring that the source/drain cap layer 230 can protect the first source-drain interconnection layer 220.

In some implementations, the material of the source/drain cap layer 230 includes one or more of silicon nitride, silicon carbide, silicon carbon nitride, silicon oxycarbonitride, silicon oxynitride, boron nitride, and boron carbon nitride.

Specifically, the material of the source/drain cap layer 230 is different from the material of the gate cap layer 240, and the material of the source/drain cap layer 230 is different from the material of the spacer 205.

In an example, the material of the source/drain cap layer 230 is silicon carbide.

In some implementations, after the gate cap layer 240 is formed, the source-drain interconnection layer 220 and the source/drain cap layer 230 are formed, to reduce impact of a forming process of the source-drain interconnection layer 220 and the source/drain cap layer 230 on the gate structure 200 under the protection of the gate cap layer 240.

Figure 7:
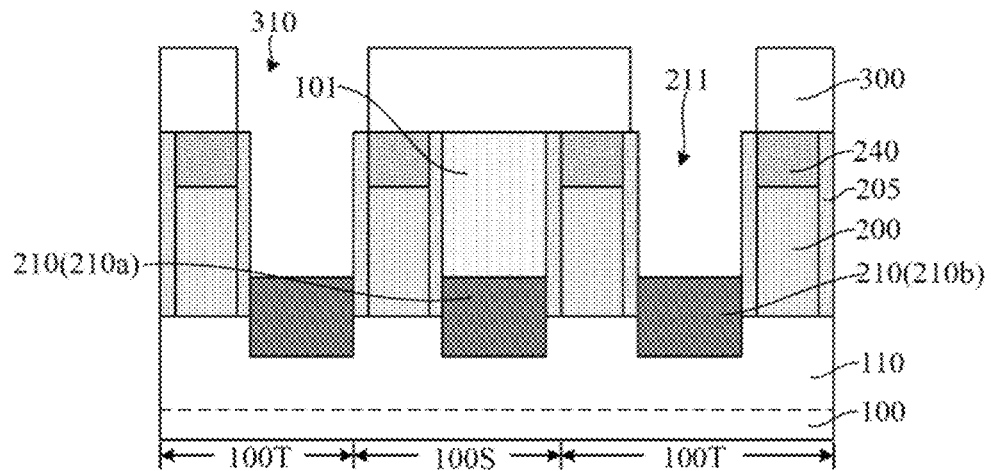
Figure 8:
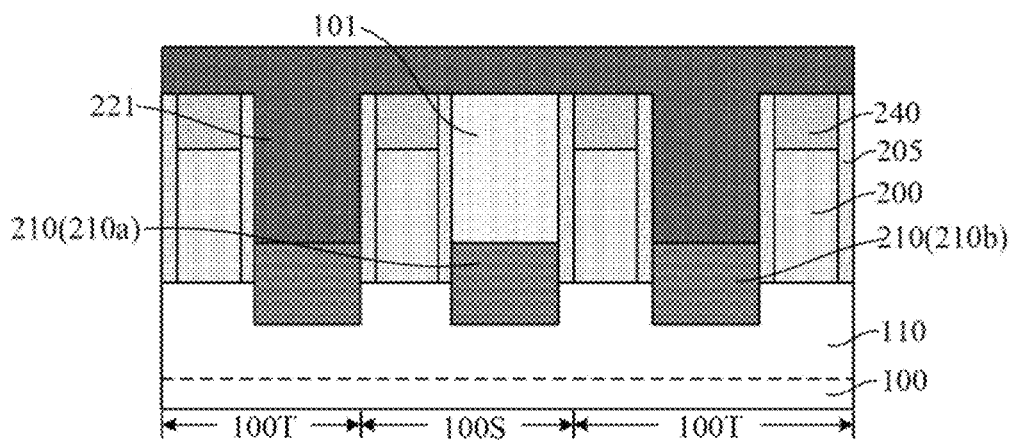
Figure 9:
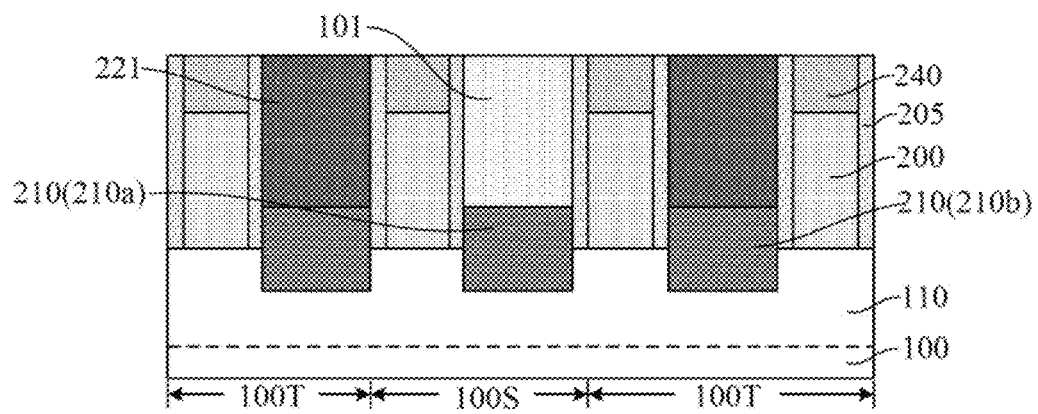
Figure 10:
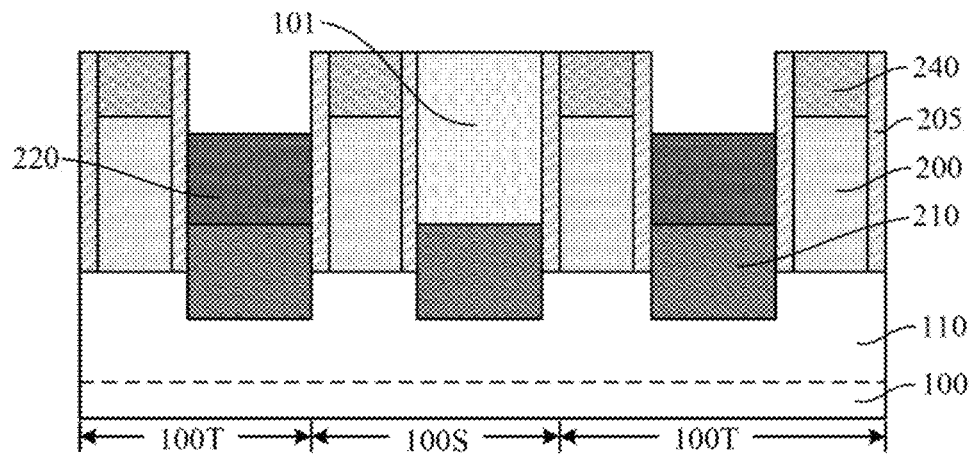
Figure 11:
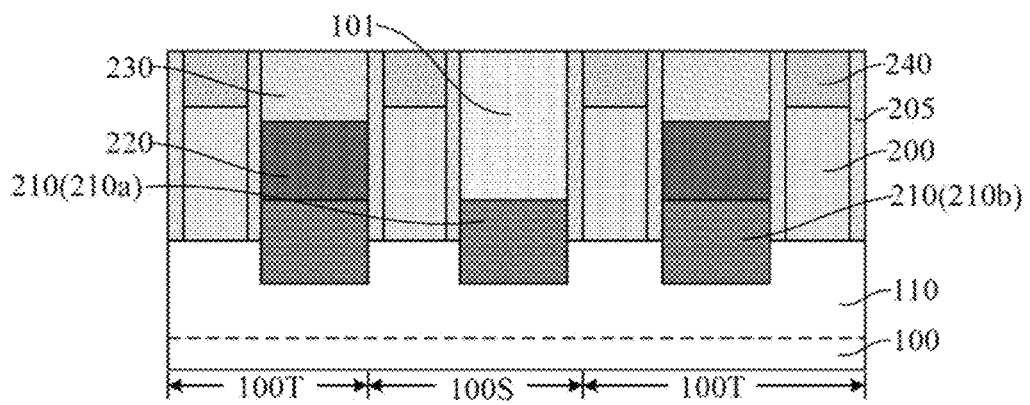

Specifically, the step of forming the first source-drain interconnection layer 220 and the source/drain cap layer 230 includes: as shown in FIG. 7, removing the bottom dielectric layer 101 on the top of the second source/drain doped region 210*b*, to form a first trench 211 exposing the second source/drain doped region 210*b*; as shown in FIG. 8 to FIG. 10, forming the first source-drain interconnection layer 220 in the first trench 211, the top of the first source-drain interconnection layer 220 being lower than the top of the bottom dielectric layer 101; and as shown in FIG. 11, forming the source/drain cap layer 230 in a region surrounded by the bottom dielectric layer 101 and the first source-drain interconnection layer 220.

The first trench 211 is used for providing space for forming the first source-drain interconnection layer 220 and the source/drain cap layer 230.

In some implementations, the bottom dielectric layer 101 on the top of the second source/drain doped region 210*b* is etched by using a dry etching process (such as an anisotropic dry etching process). The anisotropic dry etching process has an anisotropic etching property, which is beneficial to improving controllability of the cross-section of the first trench 211.

As shown in FIG. 7, in some implementations, the step of forming the first trench 211 includes: forming, on the bottom dielectric layer 101, a first mask layer 300 having a first mask opening 310, the first mask opening 310 exposing the bottom dielectric layer 101 on the top of the second source/drain doped region 210*b*; and etching, by using the first mask layer 300 as a mask, the bottom dielectric layer 101 exposed by the first mask opening 310, to form the first trench 211.

In some implementations, after the first trench 211 is formed, the first mask layer 300 is removed.

In an example, the material of the first mask layer 300 is photoresist. The first mask layer 300 is formed by using photolithographic processes such as photoresist coating, exposure, and development.

It should be noted that there is a relatively high etching selection ratio between the gate cap layer 240 and the bottom dielectric layer 101, and there is also a relatively high etching selection ratio between the spacer 205 and the bottom dielectric layer 101, so that a process window for forming the first mask opening 310 is improved.

For example, in the second direction, the first mask opening 310 not only exposes the bottom dielectric layer 101 on the top of the second source/drain doped region 210b, but may also expose the spacer 205, and may even expose the gate cap layer 240.

In some implementations, the step of forming the first source-drain interconnection layer 220 in the first trench 211 includes: as shown in FIG. 8, filling a conductive material 221 into the first trench 211; as shown in FIG. 9, performing planarization on the conductive material 221 by using the top surface of the gate cap layer 240 as a stop position; as shown in FIG. 10, performing, after the planarization, back etching on the remaining conductive material 221 in the first trench 211, the remaining conductive material 221 after the back etching being used as the first source-drain interconnection layer 220.

Through the back etching on the remaining conductive material 221 in the first trench 211, the top of the first source-drain interconnection layer 220 is lower than the top of the bottom dielectric layer 101, to reserve space for forming the source/drain cap layer 230.

In some implementations, the back etching is performed on the remaining conductive material 221 in the first trench 211 by using the dry etching process (for example, the anisotropic dry etching process).

The dry etching process helps accurately control the etched thickness of the remaining conductive material 221 in the first trench 211, and correspondingly, helps enable the thickness of the first source-drain interconnection layer 220 to satisfy process requirements.

Correspondingly, the step of forming the source/drain cap layer 230 in the region surrounded by the bottom dielectric layer 101 and the first source-drain interconnection layer 220 includes: filling a source-drain cap material layer in the remaining space of the first trench 211; and performing planarization on the source-drain cap material layer by using the top surface of the gate cap layer as a stop position, the remaining source-drain cap material layer after the planarization being used as the source/drain cap layer 230.

The hardness and the density of the gate cap layer 240 are relatively high. Therefore, the top surface of the gate cap layer 240 can well define a stop position of the planarization.

Specifically, the planarization process may be a chemical mechanical polishing process.

Figure 12:
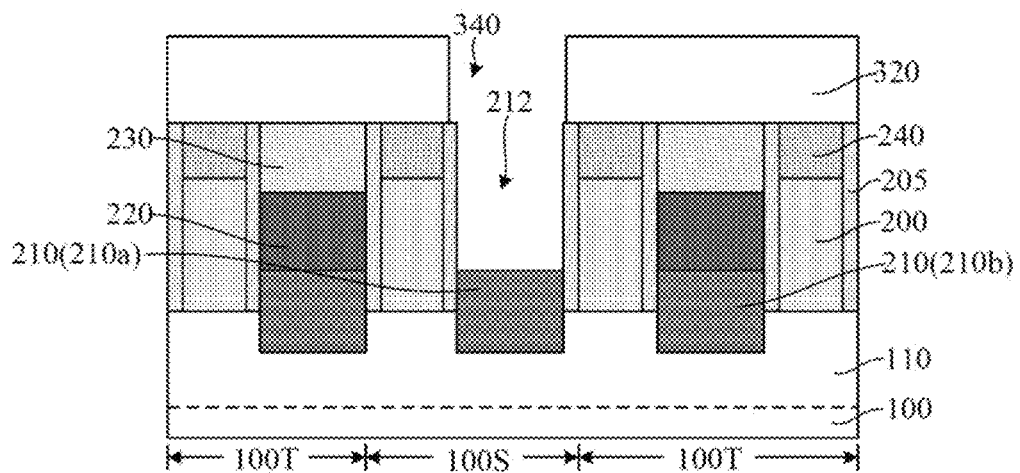
Figure 13:
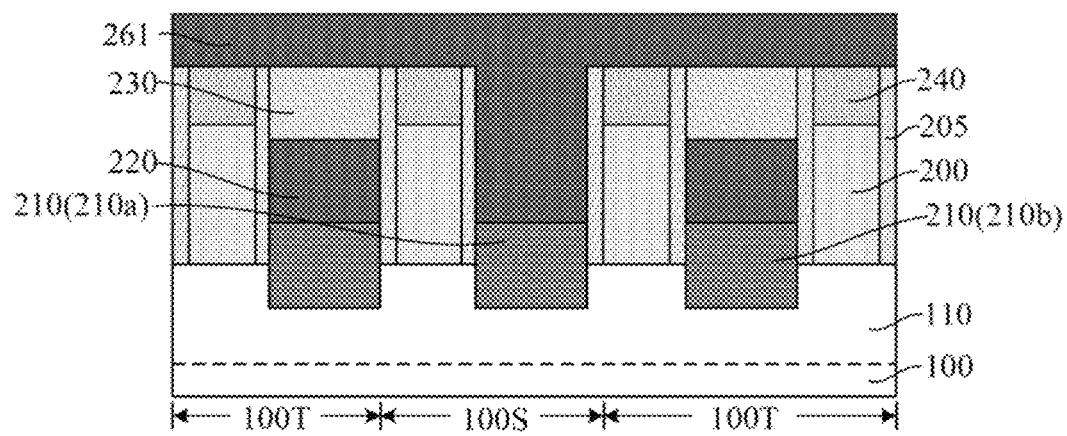
Figure 14:
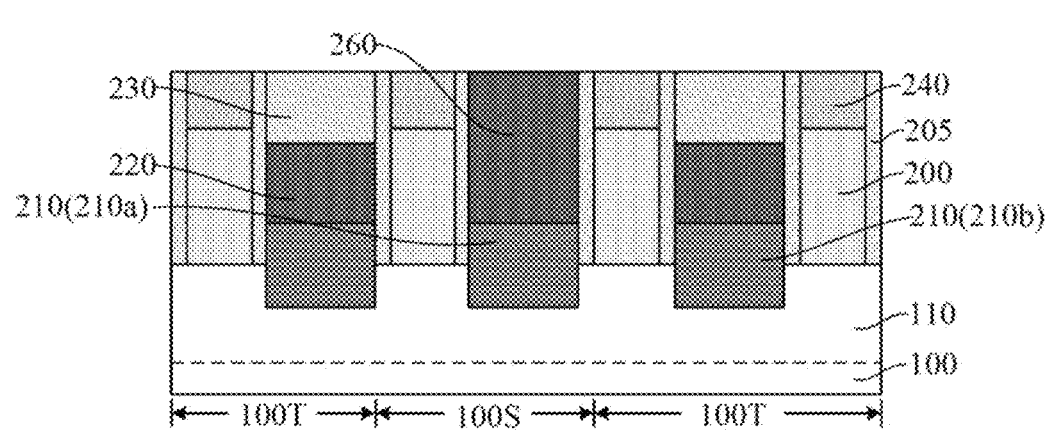

With reference to FIG. 12 to FIG. 14, a second source-drain interconnection layer 260 in contact with the first source/drain doped region 210a is formed in a bottom dielectric layer 101 on the top of the first source/drain doped region 210a.

The first source/drain doped region 210a is located in the shared contact region 100S, subsequently, a shared contact plug electrically connecting the gate structure 200 and the first source/drain doped region 210a is formed in the shared contact region 100S, and a procedure of forming the shared contact plug usually includes a step of forming a shared contact hole by using the etching process. The gate cap layer 240 is formed on the top of the gate structure 200, but the source/drain cap layer 230 is not formed on the top of the second source-drain interconnection layer 260. Therefore, in a subsequent process of forming the shared contact plug in the shared contact region 100S, there is no need to etch the source/drain cap layer, so that difficulty of an etching process adopted for forming the shared contact plug is reduced, and difficulty in forming the shared contact plug is reduced correspondingly. Moreover, this is beneficial to shortening a process time required for forming the shared contact plug, to reduce the impact of lateral etching on the top dielectric layer, so that the cross-sectional shape and the opening size of the shared contact hole are guaranteed. Correspondingly, a probability that the shared contact hole exposes the gate structure 200 or the source-drain interconnection layer that is other than the shared contact hole and that is adjacent to the shared contact hole is reduced, thereby further improving the performance of the semiconductor structure.

In some implementations, the second source-drain interconnection layer 260 and the first source-drain interconnection layer 220 are formed in different procedures, so that the modification to the current process procedure is small, and the process compatibility is relatively high.

In some implementations, the step of forming the second source-drain interconnection layer 260 includes: as shown in FIG. 12, removing the bottom dielectric layer 101 on the top of the first source/drain doped region 210a, to form a second trench 212 exposing the first source/drain doped region 210a; and as shown in FIG. 13 and FIG. 14, forming the second source-drain interconnection layer 260 in the second trench 212.

The second trench 212 is used for providing space for forming the second source-drain interconnection layer 260.

In some implementations, the bottom dielectric layer 101 on the top of the first source/drain doped region 210a is etched by using a dry etching process (such as an anisotropic dry etching process). The anisotropic dry etching process has an anisotropic etching property, which is beneficial to improving controllability of the cross-section of the second trench 212.

As shown in FIG. 12, in some implementations, the step of forming the second trench 212 includes: forming, on the bottom dielectric layer 101, a second mask layer 320 having a second mask opening 340, the second mask opening 340 exposing the bottom dielectric layer 101 on the top of the first source/drain doped region 210a; and etching, by using the second mask layer 320 as a mask, the bottom dielectric layer 101 exposed by the second mask opening 340, to form the second trench 212.

In some implementations, after the second trench 212 is formed, the second mask layer 320 is removed.

In an example, the material of the second mask layer 320 is photoresist. The second mask layer 320 is formed by using photolithographic processes such as photoresist coating, exposure, and development.

It should be noted that there is a relatively high etching selection ratio between the gate cap layer 240 and the bottom dielectric layer 101, and there is also a relatively high etching selection ratio between the spacer 205 and the bottom dielectric layer 101, so that a process window for forming the second mask opening 340 is improved.

For example, in the second direction, the second mask opening 340 not only exposes the bottom dielectric layer 101 on the top of the first source/drain doped region 210a, but may also expose the spacer 205, and may even expose the gate cap layer 240 on two sides of the first source/drain doped region 210a.

In some implementations, the step of forming the second source-drain interconnection layer 260 in the second trench 212 includes: as shown in FIG. 13, filling a conductive material 261 into the second trench 212; as shown in FIG.

14, performing planarization on the conductive material 261 by using the top surface of the gate cap layer 240 as a stop position, the remaining conductive material 261 in the second trench 212 being used as the second source-drain interconnection layer 260.

The hardness and the density of the gate cap layer 240 are relatively high. Therefore, the top surface of the gate cap layer 240 can well define a stop position of the planarization.

Specifically, the planarization process may be a chemical mechanical polishing process.

In some implementations, after the source/drain cap layer 230 is formed, the second source-drain interconnection layer 260 is formed, to prevent the second source-drain interconnection layer 260 from being damaged by a process of forming the first source-drain interconnection layer 220 and the source/drain cap layer 230. Correspondingly, in a process of forming the second source-drain interconnection layer 260, the source/drain cap layer 230 can also protect the first source-drain interconnection layer 220.

Figure 15:
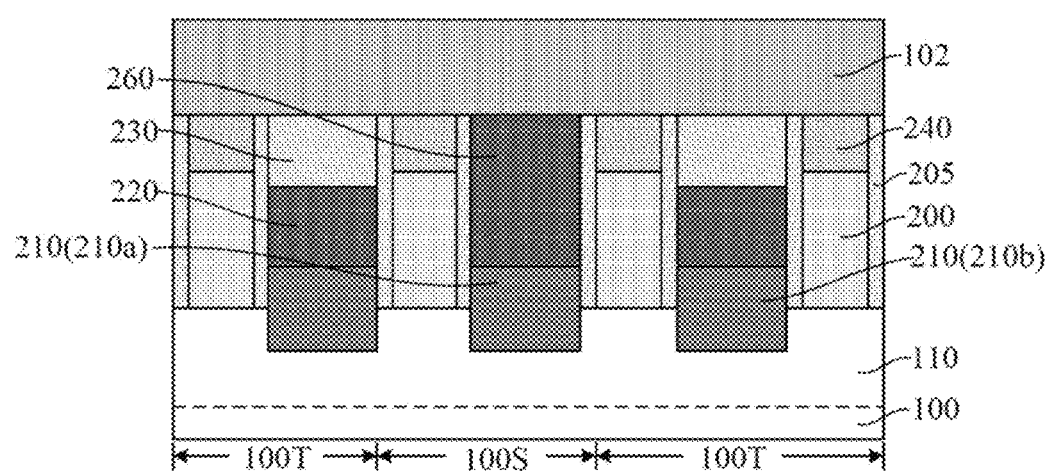

Referring to FIG. 15, a top dielectric layer 102 covering the gate cap layer 240, the source/drain cap layer 230, the second source-drain interconnection layer 260, and the bottom dielectric layer 101 is formed.

The top dielectric layer 102 is used for implementing, together with the bottom dielectric layer 101, subsequent electrical isolation between the gate plug, the source/drain plug, and the shared contact plug.

The material of the top dielectric layer 102 is a dielectric material, and the material of the top dielectric layer 102 includes one or more of silicon oxide, silicon nitride, silicon oxynitride, silicon oxycarbide, silicon carbonitride, and silicon oxy-carbonitride.

In some implementations, the top dielectric layer 102 is formed using a deposition process (for example, a chemical vapor deposition process).

In some implementations, top surfaces of the gate cap layer 240, the source/drain cap layer 230, the second source-drain interconnection layer 260, and the bottom dielectric layer 101 are flush with each other. Therefore, the top surface of the top dielectric layer 102 has relatively high flatness.

Figure 16:
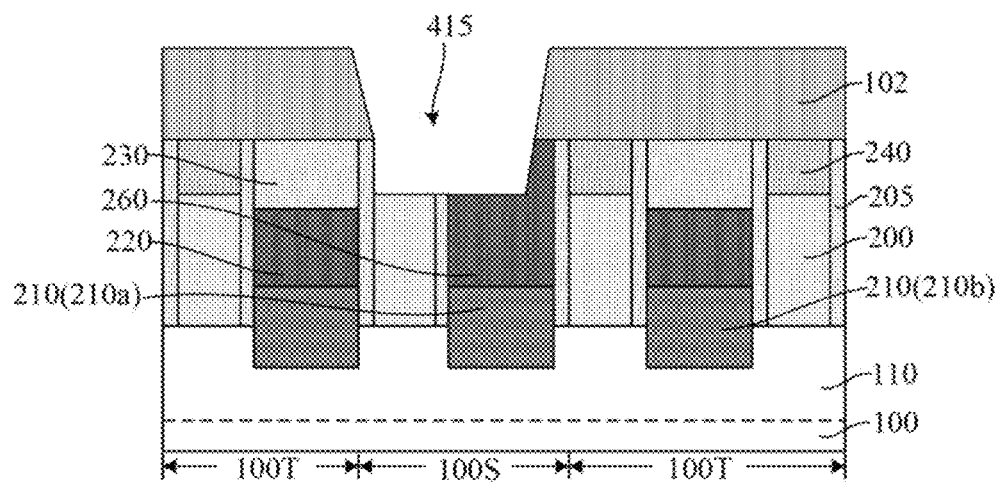
Figure 17:
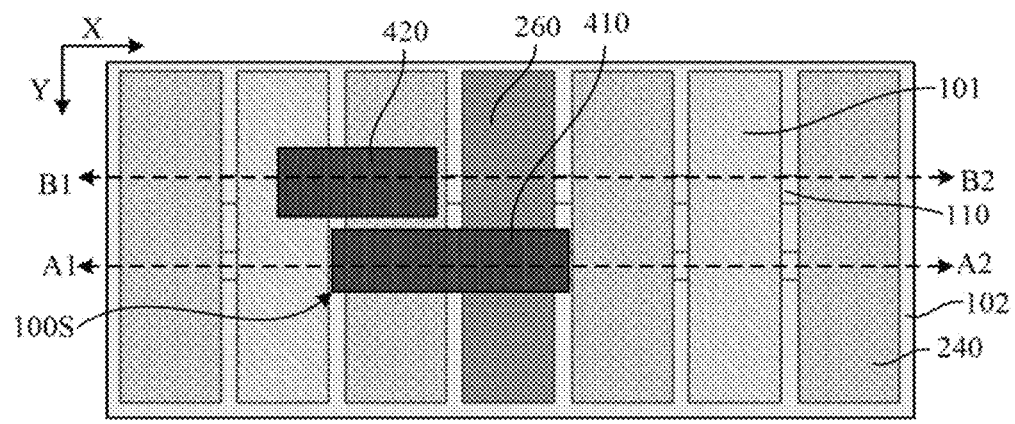
Figure 18:
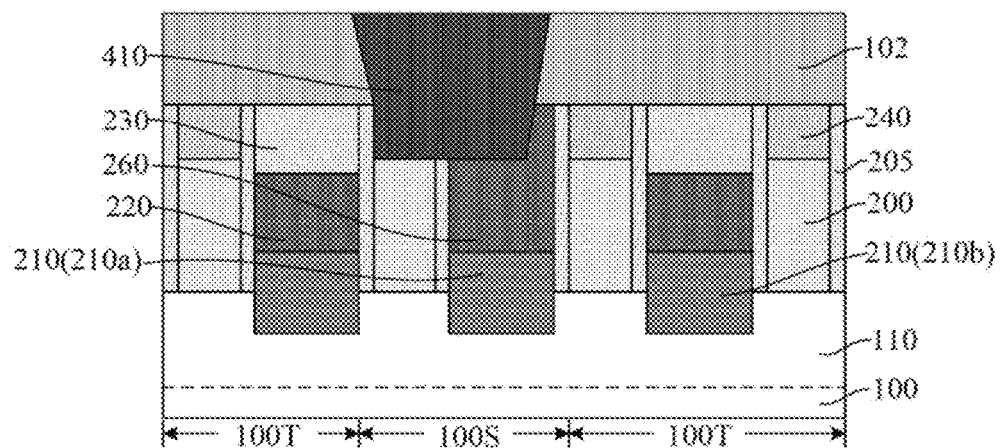

With reference to FIG. 16 to FIG. 18, a shared contact plug 410 running through the top dielectric layer 102 and the gate cap layer 240 is formed in the shared contact region 100S, and the shared contact plug 410 is in contact with the gate structure 200 and the second source-drain interconnection layer 260.

The shared contact plug 410 electrically connects the gate structure 200 to the second source-drain interconnection layer 260, to enable the gate structure 200 and the second source-drain interconnection layer 260 to connect to the same potential, thereby satisfying operation requirements of a device.

In some implementations, the step of forming the shared contact plug 410 includes the following step: as shown in FIG. 16, etching the top dielectric layer 102 and the gate cap layer 240 in the shared contact region 100S, to form a shared contact hole 415 exposing the gate structure 200 and the second source-drain interconnection layer 260.

In some implementations, when the shared contact hole 415 is formed, only the top dielectric layer 102 and the gate cap layer 240 need to be etched, and the source/drain cap layer 230 does not need to be etched, to prevent a forming process of the shared contact hole 415 from being affected by the etching selection ratio between the source/drain cap layer 230 and the gate cap layer 240, thereby reducing process difficulty in forming the shared contact hole, and correspondingly reducing process difficulty in forming the shared contact plug 410. Moreover, this is beneficial to shortening a process time required for forming the shared contact hole 415, to reduce the impact of lateral etching on the top dielectric layer 102, so that the cross-sectional shape and the opening size of the shared contact hole 415 are guaranteed. Correspondingly, a probability that the shared contact hole 415 exposes the gate structure 200 or the first source-drain interconnection layer 220 that is other than the shared contact hole 415 and that is adjacent to the shared contact hole 415 is reduced, thereby further improving the performance of the semiconductor structure.

In some implementations, because there is no need to etch the source/drain cap layer 230, the top dielectric layer 102 is less affected by lateral etching. Correspondingly, the shape and the position of the shared contact hole 415 can be defined by using one photomask, to prevent the quantity of photomasks from being increased, which is beneficial to controlling process costs correspondingly.

As shown in FIG. 17 and FIG. 18, FIG. 17 is a top view, and FIG. 18 is a cross-sectional view along a section line A1-A2 in FIG. 17. The shared contact plug 410 is formed in the shared contact hole 415 (as shown in FIG. 16).

Specifically, after the conductive material is filled into the shared contact hole 415, planarization is performed on the conductive material by using the top surface of the top dielectric layer 102 as the stop position, and the remaining conductive material is used as the shared contact plug 410.

In some implementations, a process of filling the conductive material into the shared contact hole includes one or more of the electrochemical plating process, the physical vapor deposition process, and the chemical vapor deposition process.

In some implementations, planarization is performed on the conductive material by using the chemical mechanical polishing process.

In some implementations, a material of the shared contact plug 410 is copper. The resistivity of copper is relatively low, which is beneficial to alleviating an RC signal delay at the later stage and improving a processing speed of the chip, and is also beneficial to reducing resistance of the shared contact plug 410, thereby reducing power consumption correspondingly. In other implementations, the material of the shared contact plug may alternatively be tungsten or cobalt.

It should be noted that In some implementations, after the shared contact plug 410 is formed, in the second direction, the shared contact plug 410 is isolated from the adjacent source/drain cap layer 230 through the spacer 205.

The shared contact plug 410 and the adjacent source/drain cap layer 230 are isolated through the spacer 205. Therefore, a probability of mis-etching the spacer 205 near the side of the non-shared contact region 100T is reduced in a process of forming the shared contact hole 415, to reduce a probability that to the shared contact plug 410 and the first source-drain interconnection layer 220 in the adjacent non-shared contact region 100T are short-circuited.

Figure 19:
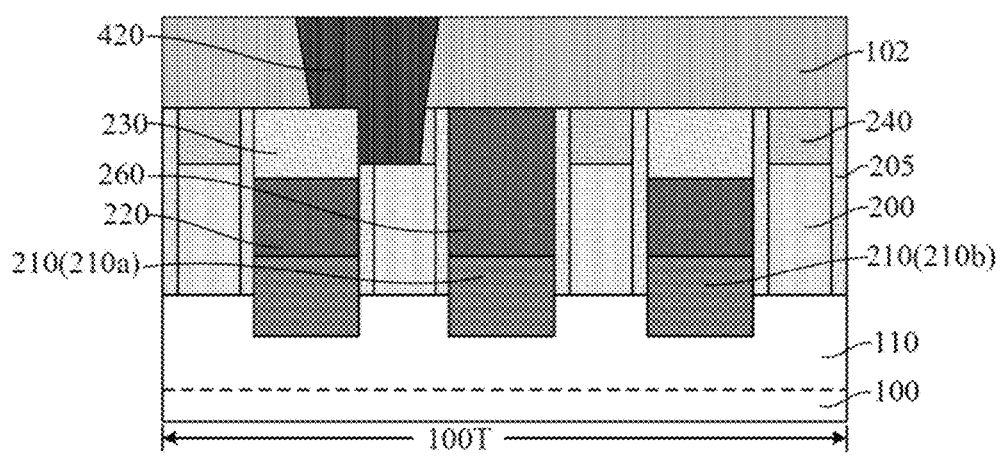

Still referring to FIG. 17, and with reference to FIG. 19, FIG. 19 is a cross-sectional view along a section line B1-B2 of FIG. 17. The forming method further includes: forming a gate plug 420 in the top dielectric layer 102 and the gate cap layer 240 on the top of the gate structure 200 in the non-shared contact region 100T, where in the second direction (as shown in an X direction in FIG. 17), the gate plug 420 is isolated from the adjacent second source-drain interconnection layer 260 through the spacer 205.

The gate plug 420 is used for electrically connecting the gate structure 200 to an external circuit or another interconnection structure.

In some implementations, the gate plug 420 is formed above the gate structure 200 of the AA, that is, the gate plug 420 is a COAG. Compared with a solution that the gate plug is in contact with the gate structure located in an isolation region, a part of the gate structure 200 located in the isolation region is omitted In some implementations, which is beneficial to saving an area of the chip and further reducing the chip size.

Specifically, the step of forming the gate plug 420 includes: etching the top dielectric layer 102 and the gate cap layer 240 in the non-shared contact region 100T, to form a gate contact hole (not shown in the figure) exposing the top of the gate structure 200; and forming the gate plug 420 in the gate contact hole.

There is a relatively high etching selection ratio between the gate cap layer 240 and the source/drain cap layer 230. Therefore, in a process of forming the gate contact hole, the source/drain cap layer 230 protects the second source-drain interconnection layer 220, to reduce a probability that the gate plug 420 and the second source-drain interconnection layer 220 are short-circuited.

In some implementations, after the conductive material is filled into the gate contact hole, planarization is performed on the conductive material by using the top surface of the top dielectric layer 102 as the stop position, and the remaining conductive material is used as the gate plug 420.

In some implementations, in the second direction (shown by a direction X in FIG. 17), the gate plug 420 and the adjacent second source-drain interconnection layer 260 are isolated through the spacer 205.

The source/drain cap layer 230 is not formed on the top of the second source-drain interconnection layer 260. Therefore, the gate plug 420 and the adjacent second source-drain interconnection layer 260 are isolated through the spacer 205, to reduce a probability that the gate plug 420 and the adjacent second source-drain interconnection layer 260 are short-circuited.

In some implementations, the forming method further includes: forming a source/drain plug (not shown in the figure) in the top dielectric layer 102 and the source/drain cap layer 230 on the top of the first source-drain interconnection layer 220 in the non-shared contact region 100T.

The source/drain plug is used for electrically connecting the second source/drain doped region 210b to an external circuit or another interconnection structure.

Detailed descriptions of the gate plug 420 and the source/drain plug is not provided in this embodiment again.

The present disclosure further provides a semiconductor structure. Still referring to FIG. 14, a schematic structural diagram of one form of a semiconductor structure according to the present disclosure is shown.

The semiconductor structure includes: a base (not marked), a gate structure 200 being formed on the base, a gate cap layer 240 being formed on the top of the gate structure 200, a source/drain doped region 210 being formed in the base on two sides of the gate structure 200, a bottom dielectric layer 101 being formed on the base at a side portion of the gate structure 200, and the bottom dielectric layer 101 covering side walls of the gate structure 200 and the gate cap layer 240, where a region that is located at the base and that is used for forming a shared contact plug electrically connecting the gate structure 200 and the source/drain doped region 210 is used as a shared contact region 100S, the source/drain doped region 210 located in the shared contact region 100S is used as a first source/drain doped region 210a, and the remaining source/drain doped region 210 is used as a second source/drain doped region 210b; and a first source-drain interconnection layer 220, located at the bottom dielectric layer 101 (as shown in FIG. 6) on the top of the second source/drain doped region 210b and connected to the second source/drain doped region 210b, the top of the first source-drain interconnection layer 220 being lower than the top of the gate cap layer 240; a source/drain cap layer 230, located in a region surrounded by the top of the first source-drain interconnection layer 220 and the bottom dielectric layer 101; a second source-drain interconnection layer 260, running through the bottom dielectric layer 101 on the top of the first source/drain doped region 210a; and a top dielectric layer 102, covering the gate cap layer 240, the source/drain cap layer 230, the second source-drain interconnection layer 260, and the bottom dielectric layer 101.

The first source/drain doped region 210a is located in the shared contact region 100S, and a top dielectric layer covering the gate cap layer 240, the source/drain cap layer 230, the second source-drain interconnection layer 260, and the bottom dielectric layer 101 is formed subsequently. After the top dielectric layer is formed, a shared contact plug electrically connecting the gate structure 200 and the first source/drain doped region 210a is formed in the shared contact region 100S. The step of forming the shared contact plug includes etching the top dielectric layer and the gate cap layer 240 in the shared contact region 100S, to form a shared contact hole exposing the gate structure 200 and the second source-drain interconnection layer 260. The gate cap layer 240 is formed on the top of the gate structure 200, but the source/drain cap layer 230 is not formed on the top of the second source-drain interconnection layer 260. Therefore, there is no need to etch the source/drain cap layer 230 in a subsequent process of forming the shared contact hole, so that difficulty of an etching process adopted for forming the shared contact plug is reduced, and difficulty in forming the shared contact plug is reduced correspondingly. Moreover, this is beneficial to shortening a process time required for forming the shared contact hole, to reduce the impact of lateral etching on the top dielectric layer, so that the cross-sectional shape and the opening size of the shared contact hole are guaranteed. Correspondingly, a probability that the shared contact hole exposes the gate structure or the first source-drain interconnection layer that is other than the shared contact hole and that is adjacent to the shared contact hole is reduced, to reduce a probability that the shared contact plug and the gate structure or the first source-drain interconnection layer that is other than the shared contact plug and that is adjacent to the shared contact plug are short-circuited, thereby further improving the performance of the semiconductor structure.

In addition, because there is no need to etch the source/drain cap layer 230, the top dielectric layer is less affected by lateral etching. When the shared contact hole is formed subsequently, correspondingly, the shape and position of the shared contact hole 415 can be defined by using one photomask, to reduce the process costs.

In some implementations, the semiconductor structure a FinFET, therefore, the base includes a substrate 100 and a fin 110 protruding from the substrate 100. In other implementations, when the semiconductor structure is a planar FET, the base is a planar substrate correspondingly.

In some implementations, the substrate 100 is a silicon substrate.

In other implementations, the substrate may alternatively be a substrate made from another type of material. For example, the substrate may be made of other materials such as germanium, silicon germanium, silicon carbide, gallium arsenide, or indium gallium, and the substrate may alternatively be another type of substrate such as a silicon substrate over an insulator or a germanium substrate over an insulator.

In some implementations, the material of the fin 110 is the same as the material of the substrate 100.

In some implementations, the semiconductor structure is an SRAM device. According to design requirements of the SRAM device, some gate structures 200 and source/drain doped regions 210 need to be electrically connected through a shared contact plug.

In some implementations, a region that is located at the base and that is used for forming a shared contact plug electrically connecting the gate structure 200 and the source/drain doped region 210 is used as a shared contact region 100S.

In some implementations, the gate structure 200 extends in a first direction (shown by a direction Y in FIG. 5), and a direction parallel to the base surface and perpendicular to the first direction is a second direction (shown by a direction X in FIG. 5). The shared contact region 100S extends in the second direction.

Specifically, there are a plurality of gate structures 200, and the plurality of gate structures 200 are arranged in parallel in the second direction.

In some implementations, a region other than the shared contact region 100S is used as a non-shared contact region 100T. Subsequently, in the non-shared contact region 100T, gate plugs in a one-to-one correspondence with the gate structures 200 and source/drain plugs in a one-to-one correspondence with the source/drain doped regions 210 are formed.

In some implementations, the semiconductor structure further includes an isolation layer (not shown in the figure), located on the substrate 100 exposed by the fin 110, the isolation layer covering a part of a side wall of the fin 110.

The isolation layer is used for isolating adjacent devices. The material of the isolation layer may be silicon oxide, silicon nitride, or silicon oxynitride. In some implementations, the material of the isolation layer is silicon nitride.

In some implementations, the gate structure 200 is located on the isolation layer, and the gate structure 200 spans the fin 110 and covers a part of the top of and a part of a side wall of the fin 110.

In some implementations, the gate structure 200 is a device gate structure, and the gate structure 200 is used for controlling on or off of a conducting channel when the device is working.

Specifically, the gate structure 200 is a metal gate structure, and the gate structure 200 includes a high-k gate dielectric layer (not shown in the figure), a work function layer (not shown in the figure) located on the high-k gate dielectric layer, and a gate electrode layer (not shown in the figure) located on the work function layer.

The material of the high-k gate dielectric layer is a high-k dielectric material, where the high-k dielectric material refers to a dielectric material having a relative dielectric constant greater than a relative dielectric constant of silicon oxide. Specifically, the material of the high-k gate dielectric layer may be selected from the $HfO_2$, $ZrO_2$, HfSiO, HfSiON, HfTaO, HfTiO, HfZrO, $Al_2O_3$, or the like.

The work function layer is used for adjusting a threshold voltage of a formed transistor. When a PMOS transistor is formed, the work function layer is a P-type work function layer, and the material of the P-type work function layer includes one or more of TiN, TaN, TaSiN, TaAlN, and TiAlN; and when an NMOS transistor. is formed, the work function layer is an N-type work function layer, and the material of the N-type work function layer includes one or more of TiAl, Mo, MoN, AlN, and TiAlC.

The gate electrode layer is used for leading out the electricity of the gate structure 200. In some implementations, the material of the gate electrode layer is Al, Cu, Ag, Au, Pt, Ni, Ti, or W.

In some implementations, the source/drain doped region 210 is located in the fin 110 on two sides of the gate structure 200.

Specifically, adjacent gate structures 200 share one source/drain doped region 210.

When the NMOS transistor is formed, the source/drain doped region 210 includes a stress layer doped with N-type ions, the material of the stress layer is Si or SiC, and the stress layer provides a tensile stress function for a channel region of the NMOS transistor, thereby facilitating improving the carrier mobility of the NMOS transistor, where the N-type ions are P ions, As ions or Sb ions. When the PMOS transistor is formed, the source/drain doped region 210 includes a stress layer doped with P-type ions, the material of the stress layer is Si or SiGe, and the stress layer provides a compressive stress function for a channel region of the PMOS transistor, thereby facilitating improving the carrier mobility of the PMOS transistor, where the P-type ions are B ions, Ga ions or In ions.

In some implementations, the source/drain doped region 210 located in the shared contact region 100S is used as a first source/drain doped region 210a, and the remaining source/drain doped region 210 is used as a second source/drain doped region 210b, that is, the source/drain doped region 210 located in the non-shared contact region 100T is used as the second source/drain doped region 210b.

It should be noted that In some implementations, a spacer 205 further is formed on a side wall of the gate structure 200.

The spacer 205 is used for defining a forming region of the source/drain doped region 210, and the spacer 205 is further used for protecting the side wall of the gate structure 200. The spacer 205 may be of a single-layer structure or a laminated structure, and the material of the spacer 205 includes one or more of silicon oxide, silicon nitride, silicon carbide, silicon carbon nitride, silicon oxycarbonitride, silicon oxynitride, boron nitride, and boron carbon nitride. In an example, the spacer 205 is of a single-layer structure, and the material of the spacer 205 is silicon nitride.

Subsequently, a source/drain plug in contact with the first source-drain interconnection layer 220 is formed on the top of the first source-drain interconnection layer 220. The gate cap layer 240 is located on a top surface of the gate structure 200, and is used for protecting the gate structure 200, to reduce, in a process of forming the source/drain plug, damage to the gate structure 200 and a probability that the source/drain plug and the gate structure 200 are short-circuited.

A material having etching selectivity to the source/drain cap layer 230, the bottom dielectric layer 101, and the top dielectric layer is selected as the material of the gate cap layer 240, which is beneficial to ensuring that the gate cap layer 240 can protect the gate structure 200.

In some implementations, the material of the gate cap layer 240 includes one or more of silicon nitride, silicon carbide, silicon carbon nitride, silicon oxycarbonitride, silicon oxynitride, boron nitride, and boron carbon nitride.

In an example, the material of the gate cap layer 240 is silicon nitride.

The materials of the gate cap layer 240 is the same as that of the spacer 205, thereby facilitating etching the spacer 205 while etching the gate cap layer 240 in a subsequent process of forming the shared contact hole, so that the complexity of an etching process is reduced. Moreover, film layer materials of relatively few types may be used in a forming process of the semiconductor structure, which is also beneficial to reducing the process complexity.

In other implementations, the gate cap layer may alternatively be made of a material different from that of the spacer.

In some implementations, the gate structure 200 is formed by adopting a high k last/metal gate last process. Therefore, the spacer 205 covers the side walls of the gate structure 200 and the gate cap layer 240.

The bottom dielectric layer 101 is used for isolating adjacent devices, and the bottom dielectric layer 101 is further used for implementing electrical isolation between the first source-drain interconnection layer 220 and the second source-drain interconnection layer 260.

In some implementations, the bottom dielectric layer 101 is an interlayer dielectric (ILD) layer.

The material of the bottom dielectric layer 101 is an insulating material, and the material of the bottom dielectric layer 101 includes one or more of silicon oxide, silicon nitride, silicon oxynitride, silicon oxycarbide, silicon carbonitride, and silicon oxy-carbonitride. In some implementations, the material of the bottom dielectric layer 101 is silicon nitride.

In some implementations, tops of the bottom dielectric layer 101, the gate cap layer 240, and the spacer 205 are flush with each other.

The first source-drain interconnection layer 220 is in contact with the second source/drain doped region 210b, and is used for electrically connecting the second source/drain doped region 210b to an external circuit or another interconnection structure.

In some implementations, subsequently, the source/drain plug in contact with the first source-drain interconnection layer 220 is formed at the first source-drain interconnection layer 220, and the source/drain plug is electrically connected to the second source/drain doped region 210b through the first source-drain interconnection layer 220.

In some implementations, the material of the first source-drain interconnection layer 220 is copper. The resistivity of copper is relatively low, which is beneficial to alleviating an RC signal delay at the later stage and improving a processing speed of the chip, and is also beneficial to reducing resistance of the first source-drain interconnection layer 220, thereby reducing power consumption correspondingly. In other embodiments, the material of the first source-drain interconnection layer may alternatively be a conductive material such as tungsten or cobalt.

Subsequently, in the non-shared contact region 100T, a gate plug in contact with the gate structure 200 is formed at the top of the gate structure 200 in the AA. The source/drain cap layer 230 is located on a top surface of the first source-drain interconnection layer 220, and is used for protecting the first source-drain interconnection layer 220 in a process of forming the gate plug, which is beneficial to reducing damage to the first source-drain interconnection layer 220 and a probability that the gate plug and the first source-drain interconnection layer 220 are short-circuited.

A material having relatively high etching selectivity to the gate cap layer 240, the spacer 205, the bottom dielectric layer 101, and the top dielectric layer 102 is selected as the material of the source/drain cap layer 230, which is beneficial to ensuring that the source/drain cap layer 230 can protect the first source-drain interconnection layer 220.

In some implementations, the material of the source/drain cap layer 230 includes one or more of silicon nitride, silicon carbide, silicon carbon nitride, silicon oxycarbonitride, silicon oxynitride, boron nitride, and boron carbon nitride.

Specifically, the material of the source/drain cap layer 230 is different from the material of the gate cap layer 240, and the material of the source/drain cap layer 230 is different from the material of the spacer 205.

In an example, the material of the source/drain cap layer 230 is silicon carbide.

The top dielectric layer 102 is used for implementing, together with the bottom dielectric layer 101, subsequent electrical isolation between the gate plug, the source/drain plug, and the shared contact plug.

The material of the top dielectric layer 102 is a dielectric material, and the material of the top dielectric layer 102 includes one or more of silicon oxide, silicon nitride, silicon oxynitride, silicon oxycarbide, silicon carbonitride, and silicon oxy-carbonitride.

In some implementations, top surfaces of the gate cap layer 240, the source/drain cap layer 230, the second source-drain interconnection layer 260, and the bottom dielectric layer 101 are flush with each other. Therefore, the top surface of the top dielectric layer 102 has relatively high flatness.

The semiconductor structure may be formed by adopting implementations of the method for forming a semiconductor structure as described above, or may be formed by adopting other forming methods. For detailed descriptions of implementations of a semiconductor structure, reference may be made to the corresponding descriptions in the foregoing embodiments and implementations, as details are not described herein again.

Although the present disclosure is disclosed above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A forming method of a semiconductor structure, comprising:
providing a base, where:
a gate structure is formed on the base,
a gate cap layer is formed on a top of the gate structure,
a source/drain doped region is formed in the base on two sides of the gate structure,
a bottom dielectric layer is formed on the base at a side portion of the gate structure, and
the bottom dielectric layer covers side walls of the gate structure and the gate cap layer,
wherein a region that is located at the base and that is used for forming a shared contact plug electrically connecting the gate structure and the source/drain doped region is used as a shared contact region, the source/drain doped region located in the shared contact region is used as a first source/drain doped region, and the remaining source/drain doped region is used as a second source/drain doped region;
forming, in the bottom dielectric layer on a top of the second source/drain doped region, a first source-drain interconnection layer connected to the second source/ drain doped region, and a source/drain cap layer located on a top of the first source-drain interconnection layer;

forming, in the bottom dielectric layer on a top of the first source/drain doped region, a second source-drain interconnection layer connected to the first source/drain doped region;

forming a top dielectric layer covering the gate cap layer, the source/drain cap layer, the second source-drain interconnection layer, and the bottom dielectric layer; and forming, in the shared contact region, a shared contact plug running through the top dielectric layer and the gate cap layer, the shared contact plug electrically connecting the gate structure and the second source-drain interconnection layer.

2. The forming method of a semiconductor structure according to claim 1, wherein after the source/drain cap layer is formed, the second source-drain interconnection layer is formed.

3. The forming method of a semiconductor structure according to claim 1, wherein the step of forming the first source-drain interconnection layer and the source/drain cap layer comprises:

removing the bottom dielectric layer on the top of the second source/drain doped region, to from a first trench exposing the second source/drain doped region;

forming a first source-drain interconnection layer in the first trench, a top of the first source-drain interconnection layer being lower than a top of the bottom dielectric layer; and forming the source/drain cap layer in a region surrounded by the bottom dielectric layer and the first source-drain interconnection layer.

4. The forming method of a semiconductor structure according to claim 3, wherein the step of forming the first source-drain interconnection layer in the first trench comprises:

filling a conductive material into the first trench;

performing planarization on the conductive material using the top surface of the gate cap layer as a stop position; and performing, after the planarization, back etching on the remaining conductive material in the first trench, the remaining conductive material after the back etching being used as the first source-drain interconnection layer.

5. The forming method of a semiconductor structure according to claim 1, wherein the step of forming the second source-drain interconnection layer comprises:

removing the bottom dielectric layer on the top of the first source/drain doped region, to from a second trench exposing the first source/drain doped region; and forming the second source-drain interconnection layer in the second trench.

6. The forming method of a semiconductor structure according to claim 5, wherein the step of forming the second source-drain interconnection layer in the second trench comprises:

filling a conductive material into the second trench; and performing planarization on the conductive material using the top surface of the gate cap layer as a stop position, the remaining conductive material in the second trench being used as the second source-drain interconnection layer.

7. The forming method of a semiconductor structure according to claim 3, wherein the step of forming the first trench comprises: forming, on the bottom dielectric layer, a first mask layer having a first mask opening, the first mask opening exposing the bottom dielectric layer on the top of the second source/drain doped region;

etching, by using the first mask layer as a mask, the bottom dielectric layer exposed by the first mask opening, to form the first trench; and removing the first mask layer after the first trench is formed.

8. The forming method of a semiconductor structure according to claim 5, wherein the step of forming the second trench comprises:

forming, on the bottom dielectric layer, a second mask layer having a second mask opening, the second mask opening exposing the bottom dielectric layer on the top of the first source/drain doped region;

etching, using the second mask layer as a mask, the bottom dielectric layer exposed by the second mask opening, to form the second trench; and removing the second mask layer after the second trench is formed.

9. The forming method of a semiconductor structure according to claim 1, wherein a material of the gate cap layer is different from that of the source/drain cap layer.

10. The forming method of a semiconductor structure according to claim 1, wherein:

the material of the gate cap layer comprises at least one of silicon nitride, silicon carbide, silicon carbon nitride, silicon oxycarbonitride, silicon oxynitride, boron nitride, or boron carbon nitride; and the material of the source/drain cap layer comprises at least one of silicon nitride, silicon carbide, silicon carbon nitride, silicon oxycarbonitride, silicon oxynitride, boron nitride, or boron carbon nitride.

11. The forming method of a semiconductor structure according to claim 1, wherein the step of forming the shared contact plug comprises:

etching the top dielectric layer and the gate cap layer in the shared contact region, to form a shared contact hole exposing the gate structure and the second source-drain interconnection layer; and forming the shared contact plug in the shared contact hole.

12. The forming method of a semiconductor structure according to claim 1, wherein:

in the step of providing the base, the gate structure extends in a first direction and is arranged in parallel in a second direction, the first direction is perpendicular to the second direction, and a spacer is formed on the side walls of gate structure and the gate cap layer; and in the step of forming the shared contact plug, in the second direction, the shared contact plug is isolated from the adjacent source/drain cap layer through the spacer.

13. The forming method of a semiconductor structure according to claim 1, wherein:

in the step of providing the base, the gate structure extends in a first direction and is arranged in parallel in a second direction, where the first direction is perpendicular to the second direction, and a spacer is formed on the side walls of the gate structure and the gate cap layer; and the forming method further comprises: forming a gate plug in the top dielectric layer and the gate cap layer located on the top of the gate structure, wherein in the second direction, the gate plug is isolated from the adjacent second source-drain interconnection layer through the spacer.

14. The forming method of a semiconductor structure according to claim 1, wherein the semiconductor structure is a static random-access memory (SRAM) device.

15. A semiconductor structure, comprising:
a base, comprising:
a gate structure formed on the base,
a gate cap layer formed on a top of the gate structure,
a source/drain doped region formed in the base on two sides of the gate structure, and
a bottom dielectric layer formed on the base at a side portion of the gate structure, the bottom dielectric layer covering side walls of the gate structure and the gate cap layer,
wherein a region that is located at the base and that is used for forming a shared contact plug electrically connecting the gate structure and the source/drain doped region is used as a shared contact region, the source/drain doped region located in the shared contact region is used as a first source/drain doped region, and the remaining source/drain doped region is used as a second source/drain doped region;
a first source-drain interconnection layer, located in a bottom dielectric layer on a top of the second source/drain doped region and connected to the second source/drain doped region, a top of the first source-drain interconnection layer being lower than a top of the gate cap layer;
a source/drain cap layer, located at a region surrounded by the top of the first source-drain interconnection layer and the bottom dielectric layer;
a second source-drain interconnection layer, running through the bottom dielectric layer on the top of the first source/drain doped region; a top dielectric layer, covering the gate cap layer, the source/drain cap layer, the second source-drain interconnection layer, and the bottom dielectric layer; and
a shared contact plug, formed in the shared contact region, running through the top dielectric layer and the gate cap layer, where the shared contact plug electrically connects the gate structure and the second source-drain interconnection layer.

16. The semiconductor structure according to claim 15, wherein a material of the gate cap layer is different from that of the source/drain cap layer.

17. The semiconductor structure according to claim 15, wherein:
the material of the gate cap layer comprises at least one of silicon nitride, silicon carbide, silicon carbon nitride, silicon oxycarbonitride, silicon oxynitride, boron nitride, or boron carbon nitride; and
the material of the source/drain cap layer comprises at least one of silicon nitride, silicon carbide, silicon carbon nitride, silicon oxycarbonitride, silicon oxynitride, boron nitride, or boron carbon nitride.

18. The semiconductor structure according to claim 15, wherein the semiconductor structure is a static random-access memory (SRAM) device.

* * * * *